(12) United States Patent
Li (10) Patent No.: US 10,121,830 B1
(45) Date of Patent: Nov. 6, 2018

(54) OLED DISPLAY PANEL AND MANUFACTURING METHOD THEREOF

(71) Applicant: Wuhan China Star Optoelectronics Semiconductor Display Technology Co., Ltd., Wuhan (CN)

(72) Inventor: Songshan Li, Wuhan (CN)

(73) Assignee: WUHAN CHINA STAR OPTOELECTRONICS SEMICONDUCTOR DISPLAY TECHNOLOGY CO., LTD., Wuhan, Hubei (CN)

( * ) Notice: Subject to any disclaimer, the term of this patent is extended or adjusted under 35 U.S.C. 154(b) by 0 days.

(21) Appl. No.: 15/569,776

(22) PCT Filed: Aug. 16, 2017

(86) PCT No.: PCT/CN2017/097571
§ 371 (c)(1),
(2) Date: Oct. 27, 2017

(30) Foreign Application Priority Data

Jun. 16, 2017 (CN) .......................... 2017 1 0459312

(51) Int. Cl.
*H01L 51/52* (2006.01)
*H01L 27/32* (2006.01)
*H01L 27/12* (2006.01)
*H01L 29/786* (2006.01)
*H01L 51/56* (2006.01)

(52) U.S. Cl.
CPC .......... *H01L 27/322* (2013.01); *H01L 27/124* (2013.01); *H01L 27/1225* (2013.01); *H01L 27/3246* (2013.01); *H01L 27/3262* (2013.01); *H01L 27/3272* (2013.01); *H01L 29/7869* (2013.01); *H01L 51/52* (2013.01); *H01L 51/5206* (2013.01); *H01L 51/5221* (2013.01); *H01L 51/5237* (2013.01); *H01L 51/56* (2013.01)

(58) Field of Classification Search
CPC ............................... H01L 27/286; H01L 27/30
See application file for complete search history.

(56) References Cited

U.S. PATENT DOCUMENTS

2018/0151654 A1* 5/2018 Lee .................. H01L 29/41733

FOREIGN PATENT DOCUMENTS

| CN | 103000661 A | 3/2013 |
|---|---|---|
| CN | 103681773 A | 3/2014 |
| CN | 104393017 A | 3/2015 |
| CN | 105404048 A | 3/2016 |

\* cited by examiner

*Primary Examiner* — Cheung Lee
(74) *Attorney, Agent, or Firm* — Leong C. Lei (57) ABSTRACT

The invention provides an OLED display panel and manufacturing method thereof, by disposing a red shielding color-resist block on the IGZO TFT to completely cover the active layer, able to reduce the influence of the high energy blue light incident from the top of the IGZO TFT on the active layer so as to prevent the leakage current and to ensure the TFT characteristics to maintain normal operation of the IGZO TFT. Moreover, the red shielding color-resist block covering the active layer only blocks the high-energy blue light influencing the active layer of the IGZO TFT while allows light of other bands to pass through; thus, the aperture ratio of the OLED display panel is not affected.

11 Claims, 4 Drawing Sheets

OLED DISPLAY PANEL AND MANUFACTURING METHOD THEREOF

BACKGROUND OF THE INVENTION

1. Field of the Invention

The present invention relates to the field of display techniques, and in particular to an OLED display panel and manufacturing method thereof.

2. The Related Arts

With the development of display technology, panel display devices such as liquid crystal display (LCD) and organic light-emitting diode (OLED) displays have become mainstream display devices. In particular, the OLED display, also known as organic electroluminescent display, is a new panel display device. Due to the advantages of simple manufacturing process, low cost, low power consumption, high luminous brightness, wide range of operating temperature, small size and thinness, fast response, ability to realize full-color display and large screen display, ease to achieve matching with integrated circuit drivers, ease to realize flexible display, the OLED display has a broad application prospect.

The OLED display can be categorized, based on the driving method, into passive matrix OLED (PMOLED) type and active matrix OLED (AMOLED) type, that is, direct addressing and thin film transistor (TFT) array addressing; wherein, the AMOLED type includes pixels arranged in an array, is an active display type, provides the advantage of high luminance efficiency, and is often used for high-resolution, large-size display devices.

The TFT is the main driving element used in LCD display and AMOLED display, and is directly related to the future progress of the high-performance panel display.

The AMOLED usually includes an OLED device comprising: a TFT substrate, an anode disposed on the TFT substrate, a hole injection layer (HIL) disposed on the anode, a hole transport layer (HTL) disposed on the HIL, a light-emitting layer disposed on the HTL, an electron transport layer (ETL) disposed on the light-emitting layer, an electron injection layer (EIL) disposed on the ETL, and a cathode disposed on the EIL. The light-emission principle behind the OLED display device is that the semiconductor materials and organic light-emitting materials are driven by the electric field, and resulted in emitting light by the carrier injection and recombination. Specifically, the AMOLED display device usually uses ITO pixel electrode and metal electrode as the anode and cathode of the device respectively. Under certain voltage driving, electrons and holes are injected from the cathode and the anode into the electron injection layer and the hole injection layer respectively. The electrons and the holes migrate through the electron transport layer and the hole transport layer to the light emitting layer respectively, and meet in the light emitting layer to form excitons to cause the light emitting molecules to excite, and the latter emits visible light by radiation relaxation.

In the flat panel industry, with more and more intense demands in large-size and high-resolution, the higher requirements on charge and discharge are put forward for the active layer of semiconductor devices. The indium gallium zinc oxide (IGZO) material has the properties of high mobility, high open current and low shut current for fast switching, which can effectively meet the above requirements and thus become the research hotspot in the field of thin film transistor technology. However, the IGZO active layer in the IGZO-TFT is very sensitive to the process and environment. Since the IGZO bandgap width (about 3.4 eV) is similar to that of the UV light (higher than 3.1 eV), the IGZO UV absorbs the UV light well. Under the UV light irradiation, valence electrons in the IGZO active layer are easy to absorb energy and transfer to the conduction band, leading to the TFT threshold voltage drift and resulting in unstable display effect. Therefore, in the conventional top gate IGZO-TFT manufacturing process, in order to prevent the IGZO active layer of the driver TFT affected by the he light generated at the bottom of the TFT from causing light leakage current, a shielding metal layer is usually manufactured at the bottom. However, for the bottom emission OLED display panel, the IGZO active layer is affected by the incident light from the top of the TFT, thereby inducing the active layer to generate a light leakage current, which affects the TFT characteristics, and even cause the TFT threshold voltage Vth offset to affect the normal operation of the TFT.

SUMMARY OF THE INVENTION

The object of the present invention is to provide an OLED display panel, by disposing a red shielding color-resist block on the IGZO TFT to completely cover the active layer, able to reduce the influence of the high energy blue light incident from the top of the IGZO TFT on the active layer so as to prevent the leakage current and to ensure the TFT characteristics to maintain normal operation of the IGZO TFT.

Another object of the present invention is to provide a manufacturing method of OLED display panel, by disposing a red shielding color-resist block on the IGZO TFT to completely cover the active layer, able to reduce the influence of the high energy blue light incident from the top of the IGZO TFT on the active layer so as to prevent the leakage current and to ensure the TFT characteristics to maintain normal operation of the IGZO TFT.

To achieve the above object, the present invention provides an OLED display panel, comprising: a base substrate, a shielding metal block disposed on the base substrate, a buffer layer disposed on the shielding metal block and the base substrate, an active layer disposed on the buffer layer and correspondingly above the shielding metal block, a gate insulating layer disposed on the active layer, a gate disposed on the gate insulating layer, an interlayer insulating layer disposed on the gate, active layer and buffer layer, a first via and a second via disposed on the interlayer insulating layer and correspondingly above two sides of the active layer, a source and a drain disposed in the interlayer insulating layer and respectively contacting the two sides of the active layer through the first via and the second via, a passivation layer disposed on the source, drain and interlayer insulating layer, a red shielding color-resist block disposed on the passivation layer and completely covering the active layer, a planarization layer disposed on the red shielding color-resist block and passivation layer, a third via disposed on the passivation layer and correspondingly above the drain, a first electrode disposed on the planarization layer and passivation layer and contacting the drain through the third via, a pixel definition layer disposed on the first electrode and the passivation layer, a fourth via disposed on the pixel definition layer and correspondingly above the first electrode, and an OLED light-emitting layer and a second electrode disposed inside the fourth via from the bottom up;

the first electrode, OLED light-emitting layer and the second electrode forming an OLED element; and the active layer being made of IGZO material.

According to a preferred embodiment of the present invention, the red shielding color-resist block disposed correspondingly above the active layer extends beyond edges of the active layer by 2-5 μm so as to completely cover the active layer.

According to a preferred embodiment of the present invention, the OLED element is a bottom-emission OLED element.

According to a preferred embodiment of the present invention, the OLED display panel further comprises a color filtering layer disposed on the passivation layer and at same level as the red shielding color-resist block;

the OLED element is a white OLED element emitting white light.

According to a preferred embodiment of the present invention, the gate, the source and the drain are made of one or more of the materials of molybdenum, aluminum, copper, titanium, and chromium; the buffer layer, the gate insulating layer, the interlayer insulating layer and the passivation layer are made of one or more of the materials of silicon oxide and silicon nitride; the first electrode is made of a transparent conductive metal oxide material.

The present invention also provides a manufacturing method of OLED display panel, comprising the steps of:

Step S1: providing a base substrate, depositing and patternizing to form a shielding metal block on the base substrate, depositing a buffer layer on the shielding metal block and the base substrate, depositing and patternizing to form an active layer on the buffer layer corresponding to above of the shielding metal block, depositing inorganic material film and a first metal layer sequentially on the active layer and the buffer layer, patternizing the inorganic material film and the first metal layer to obtain a gate insulating layer above the active layer from the inorganic material film and a gate above the gate insulating layer from the first metal layer, the gate insulating layer exposing two sides of the active layer;

the active layer being made of IGZO material;

Step S2: depositing an interlayer insulation layer on the gate, the active layer and the buffer layer, forming a first via and a second via on the interlayer insulating layer corresponding to the two sides of the active layer, depositing a second metal layer on the interlayer insulating layer, patternizing the second metal layer to obtain a source and a drain respectively contacting the two sides of the active layer through the first via and the second via;

Step S3: depositing a passivation layer on the source, the drain and the interlayer insulating layer, patternizing the passivation layer above the active layer to form a red shielding color-resist block completely covering the active layer;

Step S4: forming a planarization layer on the red shielding color-resist block and passivation layer, forming a third via on the passivation layer corresponding to above the drain, forming a first electrode on the planarization layer and the passivation layer, the first electrode contacting the drain through the third via, forming a pixel definition layer on the first electrode and the passivation layer, forming a fourth via on the pixel definition layer corresponding to above the first electrode, forming an OLED light-emitting layer and a second electrode sequentially from bottom up inside the fourth via;

the first electrode, the OLED light-emitting layer and the second electrode forming an OLED element.

According to a preferred embodiment of the present invention, in Step S3, the red shielding color-resist block formed correspondingly above the active layer extends beyond edges of the active layer by 2-5 μm so as to completely cover the active layer.

According to a preferred embodiment of the present invention, the OLED element is a bottom-emission OLED element.

According to a preferred embodiment of the present invention, the OLED element is a white OLED element emitting white light, and Step S3 further comprises: forming a color filtering layer on the passivation layer and at same level as the red shielding color-resist block.

According to a preferred embodiment of the present invention, the shielding metal block, the active layer, the gate, the source, the drain, and the first electrode are deposited by a physical vapor deposition method; the buffer layer, the gate insulating layer, the interlayer insulating layer and the passivation layer are deposited by plasma enhanced chemical vapor deposition;

the gate, the source and the drain are made of one or more of the materials of molybdenum, aluminum, copper, titanium, and chromium; the buffer layer, the gate insulating layer, the interlayer insulating layer and the passivation layer are made of one or more of the materials of silicon oxide and silicon nitride; the first electrode is made of a transparent conductive metal oxide material;

Step S1 further comprises: using the gate and the gate insulating layer as a shielding layer to perform a plasma treatment on the active layer to become a conductor;

in Step S1, the specific process for patternizing the inorganic material film and the first metal layer comprises: performing wet etching on the first metal layer to obtain a gate corresponding to above the active layer, and then performing dry etching on inorganic material film with the gate as a shielding layer to obtain a gate insulating layer having the same shape as the gate.

The present invention also provides an OLED display panel, comprising: a base substrate, a shielding metal block disposed on the base substrate, a buffer layer disposed on the shielding metal block and the base substrate, an active layer disposed on the buffer layer and correspondingly above the shielding metal block, a gate insulating layer disposed on the active layer, a gate disposed on the gate insulating layer, an interlayer insulating layer disposed on the gate, active layer and buffer layer, a first via and a second via disposed on the interlayer insulating layer and correspondingly above two sides of the active layer, a source and a drain disposed in the interlayer insulating layer and respectively contacting the two sides of the active layer through the first via and the second via, a passivation layer disposed on the source, drain and interlayer insulating layer, a red shielding color-resist block disposed on the passivation layer and completely covering the active layer, a planarization layer disposed on the red shielding color-resist block and passivation layer, a third via disposed on the passivation layer and correspondingly above the drain, a first electrode disposed on the planarization layer and passivation layer and contacting the drain through the third via, a pixel definition layer disposed on the first electrode and the passivation layer, a fourth via disposed on the pixel definition layer and correspondingly above the first electrode, and an OLED light-emitting layer and a second electrode disposed inside the fourth via from the bottom up;

the first electrode, OLED light-emitting layer and the second electrode forming an OLED element; and the active layer being made of IGZO material;

wherein the red shielding color-resist block disposed correspondingly above the active layer extending beyond edges of the active layer by 2-5 μm so as to completely cover the active layer;

wherein the OLED element being a bottom-emission OLED element;

further comprising a color filtering layer disposed on the passivation layer and at same level as the red shielding color-resist block;

the OLED element being a white OLED element emitting white light;

wherein the gate, the source and the drain being made of one or more of the materials of molybdenum, aluminum, copper, titanium, and chromium; the buffer layer, the gate insulating layer, the interlayer insulating layer and the passivation layer being made of one or more of the materials of silicon oxide and silicon nitride; the first electrode being made of a transparent conductive metal oxide material.

Compared to the known techniques, the present invention provides the following advantages. The present invention provides an OLED display panel and manufacturing method thereof, by disposing a red shielding color-resist block on the IGZO TFT to completely cover the active layer, able to reduce the influence of the high energy blue light incident from the top of the IGZO TFT on the active layer so as to prevent the leakage current and to ensure the TFT characteristics to maintain normal operation of the IGZO TFT. Moreover, the red shielding color-resist block covering the active layer only blocks the high-energy blue light influencing the active layer of the IGZO TFT while allows light of other bands to pass through; thus, the aperture ratio of the OLED display panel is not affected.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technique means and effect of the present invention, the following uses preferred embodiments and drawings for detailed description.

Figure 5:
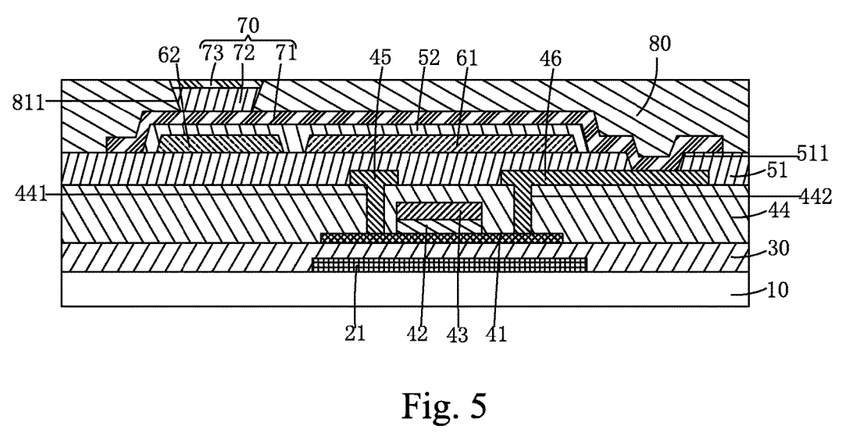
FIG. 5 is a schematic view showing Step S4 of the manufacturing method of OLED display panel and the structure of the OLED display panel provided by an embodiment of the present invention.

Referring to FIG. 5, the present invention provides an OLED display panel, comprising: a base substrate 10, a shielding metal block 21 disposed on the base substrate 10, a buffer layer 30 disposed on the shielding metal block 21 and the base substrate 10, an active layer 41 disposed on the buffer layer 30 and correspondingly above the shielding metal block 21, a gate insulating layer 42 disposed on the active layer 41, a gate 43 disposed on the gate insulating layer 42, an interlayer insulating layer 44 disposed on the gate 43, active layer 41 and buffer layer 30, a first via 441 and a second via 442 disposed on the interlayer insulating layer 44 and correspondingly above two sides of the active layer 41, a source 45 and a drain 46 disposed in the interlayer insulating layer 44 and respectively contacting the two sides of the active layer 41 through the first via 441 and the second via 442, a passivation layer 51 disposed on the source 45, drain 46 and interlayer insulating layer 44, a red shielding color-resist block 61 disposed on the passivation layer 51 and completely covering the active layer 41, a planarization layer 52 disposed on the red shielding color-resist block 61 and passivation layer 51, a third via 511 disposed on the passivation layer 51 and correspondingly above the drain 46, a first electrode 71 disposed on the planarization layer 52 and passivation layer 51 and contacting the drain 46 through the third via 511, a pixel definition layer 80 disposed on the first electrode 71 and the passivation layer 51, a fourth via 811 disposed on the pixel definition layer 80 and correspondingly above the first electrode 71, and an OLED light-emitting layer 72 and a second electrode 74 disposed inside the fourth via 811 from the bottom up.

The first electrode 71, OLED light-emitting layer 72 and the second electrode 73 form an OLED element 70; and the active layer 41 is made of IGZO material. The active layer 41, gate 43, source 45 and drain 46 form a TFT, which is an IGZO TFT.

The OLED display panel of the present invention, by disposing a red shielding color-resist block 61 on the IGZO TFT to completely cover the active layer 41, is able to reduce the influence of the high energy blue light incident from the top of the IGZO TFT on the active layer 41 so as to prevent the leakage current and to ensure the TFT characteristics to maintain normal operation of the IGZO TFT. Moreover, the red shielding color-resist block 61 covering the active layer 41 only blocks the high-energy blue light influencing the active layer 41 of the IGZO TFT while allows light of other bands to pass through; thus, the aperture ratio of the OLED display panel is not affected.

Specifically, in the above embodiment, the TFT is a driving TFT for driving OLED element 70. For the switch TFT in the OLED display panel, a similar approach can be used to dispose a red shielding color-resist block 61 above the switch TFT to shield the blue light. However, as the OLED display panel usually does not require high performance switch TFT, the disposition of ed shielding color-resist block 61 above the switch TFT may not be necessary.

Specifically, the red shielding color-resist block 61 disposed correspondingly above the active layer 41 extends beyond edges of the active layer 41 by 2-5 μm so as to completely cover the active layer 41. In other words, each side of the red shielding color-resist block 61 must exceed the corresponding side of the active layer 41 by 2-5 μm so as to completely cover the active layer 41.

Specifically, the OLED element 70 is a bottom-emission OLED element.

Specifically, the OLED element 70 is a white OLED element emitting white light; and the OLED display panel further comprises a color filtering layer 62 disposed on the passivation layer 51 and at same level as the red shielding color-resist block 61.

Specifically, the gate 43, the source 45 and the drain 46 are made of one or more of the materials of molybdenum (Mo), aluminum (Al), copper (Cu), titanium (Ti), and chromium (Cr); preferably, the source 45 and the drain 46 are all stacked layers with Cu and Mo—Ti alloy.

Specifically, the buffer layer 30, the gate insulating layer 42, the interlayer insulating layer 44 and the passivation layer 51 are made of one or more of the materials of silicon oxide ($SiO_x$) and silicon nitride ($SiN_x$); preferably, he buffer layer 30, the gate insulating layer 42, the interlayer insulating layer 44 and the passivation layer 51 are made of $SiO_x$.

Specifically, the first electrode 71 and the second electrode 72 are used as the anode and the cathode of the OLED element 70 respectively. The first electrode 71 is made of a transparent conductive metal oxide material; preferably, the first electrode 71 is made of indium-tin-oxide (ITO).

Specifically, the shielding metal block 21 is made of metal; preferably, the shielding metal block is made of Mo—Ti alloy.

Figure 1:
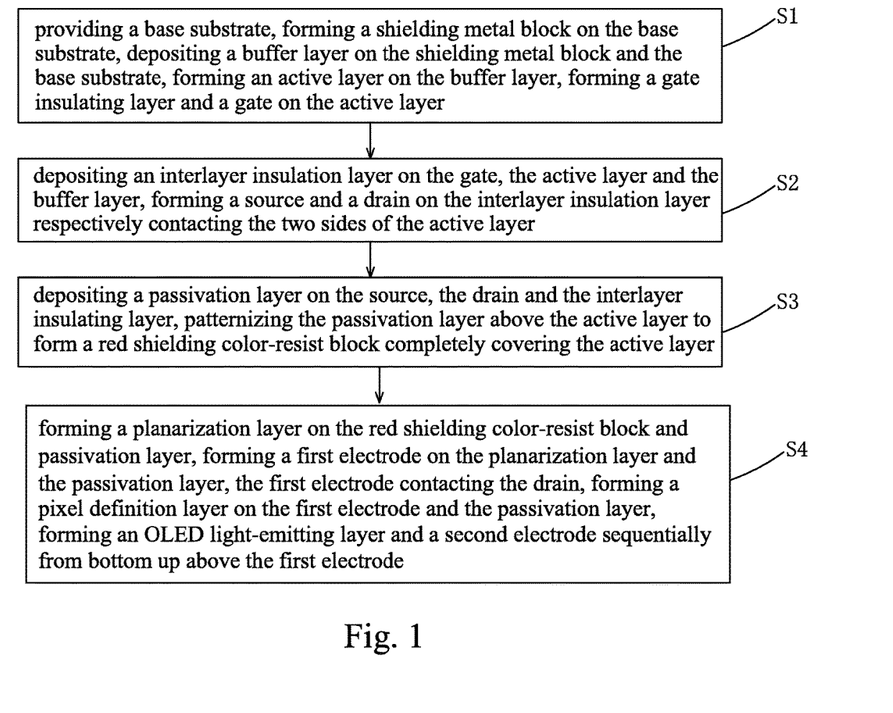
FIG. 1 is a schematic view showing a flowchart of the manufacturing method of OLED display panel provided by an embodiment of the present invention.
Figure 2:
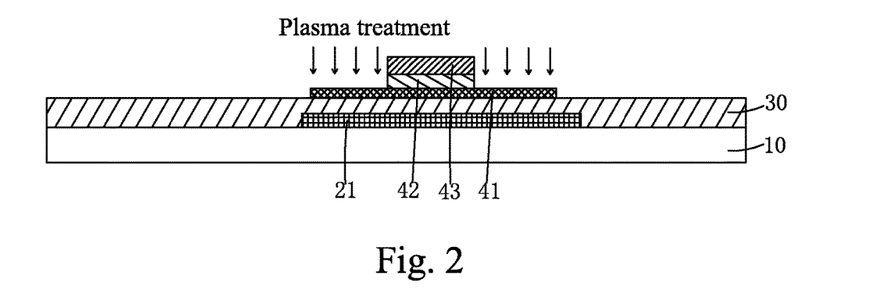
FIG. 2 is a schematic view showing Step S1 of the manufacturing method of OLED display panel provided by an embodiment of the present invention.

Refer to FIG. 1. Based on the above OLED display panel, the present invention also provides a manufacturing method of OLED display panel, comprising the steps of:

Step S1: as shown in FIG. 2, providing a base substrate 10, depositing and patternizing to form a shielding metal block 21 on the base substrate 10, depositing a buffer layer 30 on the shielding metal block 21 and the base substrate 10, depositing and patternizing to form an active layer 41 on the buffer layer 30 corresponding to above of the shielding metal block 21, depositing an inorganic material film and a first metal layer sequentially on the active layer 41 and the buffer layer 30, patternizing the inorganic material film and the first metal layer to obtain a gate insulating layer 42 above the active layer 41 from the inorganic material film and a gate 43 above the gate insulating layer 42 from the first metal layer, the gate insulating layer 42 exposing two sides of the active layer 41, using the gate 43 and the gate insulating layer 42 as a shielding layer to perform a plasma treatment on the active layer 41 to become a conductor.

Specifically, the active layer 41 is made of IGZO material.

Specifically, in Step S1, the specific process for patternizing the inorganic material film and the first metal layer comprises: performing wet etching on the first metal layer to obtain a gate 43 corresponding to above the active layer 41, and then performing dry etching on inorganic material film with the gate 43 as a shielding layer to obtain a gate insulating layer 42 having the same shape as the gate 43.

Figure 3:
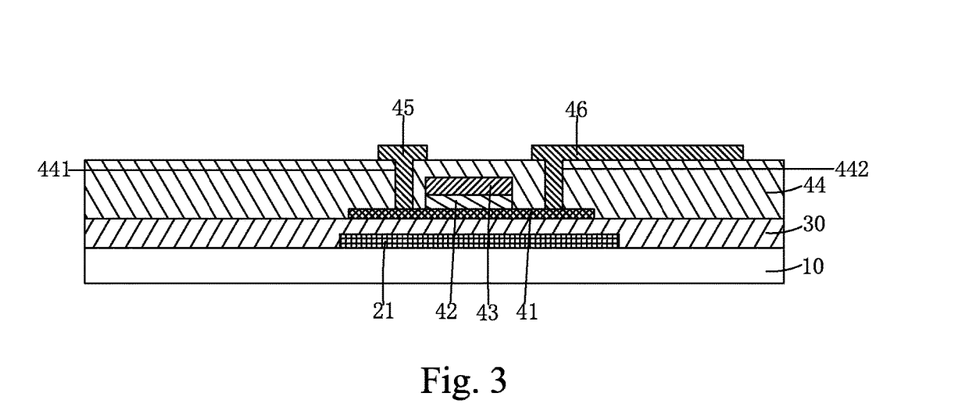
FIG. 3 is a schematic view showing Step S2 of the manufacturing method of OLED display panel provided by an embodiment of the present invention.

Step S2: as shown in FIG. 3, depositing an interlayer insulation layer 44 on the gate 43, the active layer 41 and the buffer layer 30, forming a first via 441 and a second via 442 on the interlayer insulating layer 44 corresponding to the two sides of the active layer 41, depositing a second metal layer on the interlayer insulating layer 44, patternizing the second metal layer to obtain a source 45 and a drain 46 respectively contacting the two sides of the active layer 41 through the first via 441 and the second via 442.

Specifically, the active layer 41, gate 43, source 45 and drain 46 form a TFT, which is an IGZO TFT.

Figure 4:
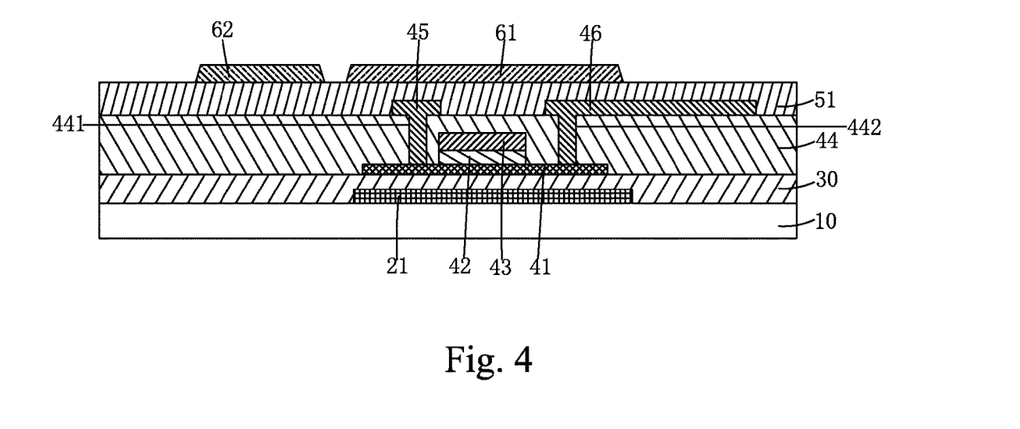
FIG. 4 is a schematic view showing Step S3 of the manufacturing method of OLED display panel provided by an embodiment of the present invention.

Step S3: as shown in FIG. 4, depositing a passivation layer 51 on the source 45, the drain 46 and the interlayer insulating layer 51, patternizing the passivation layer 51 above the active layer 41 to form a red shielding color-resist block 61 completely covering the active layer 41.

Specifically, in Step S3, the red shielding color-resist block 61 formed correspondingly above the active layer 41 extends beyond edges of the active layer 41 by 2-5 μm so as to completely cover the active layer 41.

Step S4: as shown in FIG. 5, forming a planarization layer 52 on the red shielding color-resist block 61 and passivation layer 51, forming a third via 511 on the passivation layer 51 corresponding to above the drain 46, forming a first electrode 71 on the planarization layer 52 and the passivation layer 51, the first electrode 71 contacting the drain 46 through the third via 511, forming a pixel definition layer 80 on the first electrode 71 and the passivation layer 51, forming a fourth via 811 on the pixel definition layer 80 corresponding to above the first electrode 71, forming an OLED light-emitting layer 72 and a second electrode 73 sequentially from bottom up inside the fourth via 811; the first electrode 71, the OLED light-emitting layer 72 and the second electrode 73 forming an OLED element 70; the first electrode 71 and the second electrode 73 being the anode and the cathode of the OLED element 70 respectively.

The manufacturing method of OLED display panel of the present invention, by disposing a red shielding color-resist block 61 on the IGZO TFT to completely cover the active layer 41, is able to reduce the influence of the high energy blue light incident from the top of the IGZO TFT on the active layer 41 so as to prevent the leakage current and to ensure the TFT characteristics to maintain normal operation of the IGZO TFT. Moreover, the red shielding color-resist block 61 covering the active layer 41 only blocks the high-energy blue light influencing the active layer 41 of the IGZO TFT while allows light of other bands to pass through; thus, the aperture ratio of the OLED display panel is not affected.

Specifically, the OLED element 70 is a bottom-emission OLED element.

Specifically, the OLED element 70 is a white OLED element emitting white light, and Step S3 further comprises: forming a color filtering layer 62 on the passivation layer 51 and at same level as the red shielding color-resist block 61.

Specifically, the shielding metal block 21, the active layer 41, the gate 43, the source 45, the drain 46, and the first electrode 71 are deposited by a physical vapor deposition (PVD) method; the buffer layer 30, the gate insulating layer 42, the interlayer insulating layer 44 and the passivation layer 51 are deposited by plasma enhanced chemical vapor deposition (PECVD).

Specifically, the gate 43, the source 45 and the drain 46 are made of one or more of the materials of molybdenum (Mo), aluminum (Al), copper (Cu), titanium (Ti), and chromium (Cr); preferably, the source 45 and the drain 46 are all stacked layers with Cu and Mo—Ti alloy.

Specifically, the buffer layer 30, the gate insulating layer 42, the interlayer insulating layer 44 and the passivation layer 51 are made of one or more of the materials of silicon oxide ($SiO_x$) and silicon nitride ($SiN_x$); preferably, he buffer layer 30, the gate insulating layer 42, the interlayer insulating layer 44 and the passivation layer 51 are made of $SiO_x$.

Specifically, the first electrode 71 and the second electrode 72 are used as the anode and the cathode of the OLED element 70 respectively. The first electrode 71 is made of a transparent conductive metal oxide material; preferably, the first electrode 71 is made of indium-tin-oxide (ITO).

Specifically, the shielding metal block 21 is made of metal; preferably, the shielding metal block is made of Mo—Ti alloy.

In summary, the present invention provides an OLED display panel and manufacturing method thereof, by disposing a red shielding color-resist block on the IGZO TFT to completely cover the active layer, able to reduce the influence of the high energy blue light incident from the top of the IGZO TFT on the active layer so as to prevent the leakage current and to ensure the TFT characteristics to maintain normal operation of the IGZO TFT. Moreover, the red shielding color-resist block covering the active layer only blocks the high-energy blue light influencing the active layer of the IGZO TFT while allows light of other bands to pass through; thus, the aperture ratio of the OLED display panel is not affected.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. An organic light-emitting diode (OLED) display panel, comprising: a base substrate, a shielding metal block disposed on the base substrate, a buffer layer disposed on the shielding metal block and the base substrate, an active layer disposed on the buffer layer and correspondingly above the shielding metal block, a gate insulating layer disposed on the active layer, a gate disposed on the gate insulating layer, an interlayer insulating layer disposed on the gate, active layer and buffer layer, a first via and a second via disposed on the interlayer insulating layer and correspondingly above two sides of the active layer, a source and a drain disposed in the interlayer insulating layer and respectively contacting the two sides of the active layer through the first via and the second via, a passivation layer disposed on the source, drain and interlayer insulating layer, a red shielding color-resist block disposed on the passivation layer and completely covering the active layer, a planarization layer disposed on the red shielding color-resist block and passivation layer, a third via disposed on the passivation layer and correspondingly above the drain, a first electrode disposed on the planarization layer and passivation layer and contacting the drain through the third via, a pixel definition layer disposed on the first electrode and the passivation layer, a fourth via disposed on the pixel definition layer and correspondingly above the first electrode, and an OLED light-emitting layer and a second electrode disposed inside the fourth via from the bottom up;

the first electrode, OLED light-emitting layer and the second electrode forming an OLED element; and the active layer being made of IGZO material.

2. The OLED display panel as claimed in claim 1, wherein the red shielding color-resist block disposed correspondingly above the active layer extends beyond edges of the active layer by 2-5 μm so as to completely cover the active layer.

3. The OLED display panel as claimed in claim 1, wherein the OLED element is a bottom-emission OLED element.

4. The OLED display panel as claimed in claim 3, wherein the OLED display panel further comprises a color filtering layer disposed on the passivation layer and at same level as the red shielding color-resist block;

the OLED element is a white OLED element emitting white light.

5. The OLED display panel as claimed in claim 1, wherein the gate, the source and the drain are made of one or more of the materials of molybdenum, aluminum, copper, titanium, and chromium; the buffer layer, the gate insulating layer, the interlayer insulating layer and the passivation layer are made of one or more of the materials of silicon oxide and silicon nitride; the first electrode is made of a transparent conductive metal oxide material.

6. A manufacturing method of organic light-emitting diode (OLED) display panel, comprising the steps of:

Step S1: providing a base substrate, depositing and patternizing to form a shielding metal block on the base substrate, depositing a buffer layer on the shielding metal block and the base substrate, depositing and patternizing to form an active layer on the buffer layer corresponding to above of the shielding metal block, depositing inorganic material film and a first metal layer sequentially on the active layer and the buffer layer, patternizing the inorganic material film and the first metal layer to obtain a gate insulating layer above the active layer from the inorganic material film and a gate above the gate insulating layer from the first metal layer, the gate insulating layer exposing two sides of the active layer;

the active layer being made of IGZO material;

Step S2: depositing an interlayer insulation layer on the gate, the active layer and the buffer layer, forming a first via and a second via on the interlayer insulating layer corresponding to the two sides of the active layer, depositing a second metal layer on the interlayer insulating layer, patternizing the second metal layer to obtain a source and a drain respectively contacting the two sides of the active layer through the first via and the second via;

Step S3: depositing a passivation layer on the source, the drain and the interlayer insulating layer, patternizing the passivation layer above the active layer to form a red shielding color-resist block completely covering the active layer;

Step S4: forming a planarization layer on the red shielding color-resist block and passivation layer, forming a third via on the passivation layer corresponding to above the drain, forming a first electrode on the planarization layer and the passivation layer, the first electrode contacting the drain through the third via, forming a pixel definition layer on the first electrode and the passivation layer, forming a fourth via on the pixel definition layer corresponding to above the first electrode, forming an OLED light-emitting layer and a second electrode sequentially from bottom up inside the fourth via;

the first electrode, the OLED light-emitting layer and the second electrode forming an OLED element.

7. The manufacturing method of OLED display panel as claimed in claim 6, wherein in Step S3, the red shielding color-resist block formed correspondingly above the active layer extends beyond edges of the active layer by 2-5 μm so as to completely cover the active layer.

8. The manufacturing method of OLED display panel as claimed in claim 6, wherein the OLED element is a bottom-emission OLED element.

9. The manufacturing method of OLED display panel as claimed in claim 8, wherein the OLED element is a white OLED element emitting white light, and Step S3 further comprises: forming a color filtering layer on the passivation layer and at same level as the red shielding color-resist block.

10. The manufacturing method of OLED display panel as claimed in claim 6, wherein the shielding metal block, the active layer, the gate, the source, the drain, and the first electrode are deposited by a physical vapor deposition method; the buffer layer, the gate insulating layer, the interlayer insulating layer and the passivation layer are deposited by plasma enhanced chemical vapor deposition;

the gate, the source and the drain are made of one or more of the materials of molybdenum, aluminum, copper, titanium, and chromium; the buffer layer, the gate insulating layer, the interlayer insulating layer and the passivation layer are made of one or more of the materials of silicon oxide and silicon nitride; the first electrode is made of a transparent conductive metal oxide material;

Step S1 further comprises: using the gate and the gate insulating layer as a shielding layer to perform a plasma treatment on the active layer to become a conductor;

in Step S1, the specific process for patternizing the inorganic material film and the first metal layer comprises: performing wet etching on the first metal layer to obtain a gate corresponding to above the active layer, and then performing dry etching on inorganic material film with the gate as a shielding layer to obtain a gate insulating layer having the same shape as the gate.

11. An organic light-emitting diode (OLED) display panel, comprising: a base substrate, a shielding metal block disposed on the base substrate, a buffer layer disposed on the shielding metal block and the base substrate, an active layer disposed on the buffer layer and correspondingly above the shielding metal block, a gate insulating layer disposed on the active layer, a gate disposed on the gate insulating layer, an interlayer insulating layer disposed on the gate, active layer and buffer layer, a first via and a second via disposed on the interlayer insulating layer and correspondingly above two sides of the active layer, a source and a drain disposed in the interlayer insulating layer and respectively contacting the two sides of the active layer through the first via and the second via, a passivation layer disposed on the source, drain and interlayer insulating layer, a red shielding color-resist block disposed on the passivation layer and completely covering the active layer, a planarization layer disposed on the red shielding color-resist block and passivation layer, a third via disposed on the passivation layer and correspondingly above the drain, a first electrode disposed on the planarization layer and passivation layer and contacting the drain through the third via, a pixel definition layer disposed on the first electrode and the passivation layer, a fourth via disposed on the pixel definition layer and correspondingly above the first electrode, and an OLED light-emitting layer and a second electrode disposed inside the fourth via from the bottom up;

the first electrode, OLED light-emitting layer and the second electrode forming an OLED element; and the active layer being made of IGZO material;

wherein the red shielding color-resist block disposed correspondingly above the active layer extending beyond edges of the active layer by 2-5 μm so as to completely cover the active layer;

wherein the OLED element being a bottom-emission OLED element;

wherein the OLED display panel further comprising a color filtering layer disposed on the passivation layer and at same level as the red shielding color-resist block;

the OLED element being a white OLED element emitting white light;

wherein the gate, the source and the drain being made of one or more of the materials of molybdenum, aluminum, copper, titanium, and chromium; the buffer layer, the gate insulating layer, the interlayer insulating layer and the passivation layer being made of one or more of the materials of silicon oxide and silicon nitride; the first electrode being made of a transparent conductive metal oxide material.

* * * * *